United States Patent

Sridhar

(10) Patent No.: US 9,337,330 B2
(45) Date of Patent: May 10, 2016

(54) SCHEME TO ALIGN LDMOS DRAIN EXTENSION TO MOAT

(71) Applicant: Texas Instruments Incorporated, Dallas, TX (US)

(72) Inventor: Seetharaman Sridhar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/572,923

(22) Filed: Dec. 17, 2014

(65) Prior Publication Data

US 2015/0179792 A1 Jun. 25, 2015

Related U.S. Application Data

(60) Provisional application No. 61/918,394, filed on Dec. 19, 2013.

(51) Int. Cl.

| | |
|---|---|
| H01L 29/78 | (2006.01) |
| H01L 29/66 | (2006.01) |
| H01L 29/167 | (2006.01) |
| H01L 29/08 | (2006.01) |
| H01L 29/10 | (2006.01) |
| H01L 21/027 | (2006.01) |
| H01L 21/762 | (2006.01) |
| H01L 21/266 | (2006.01) |
| H01L 21/265 | (2006.01) |

(52) U.S. Cl.
CPC ........ *H01L 29/7816* (2013.01); *H01L 21/0271* (2013.01); *H01L 21/762* (2013.01); *H01L 29/0878* (2013.01); *H01L 29/1095* (2013.01); *H01L 29/167* (2013.01); *H01L 29/66659* (2013.01); *H01L 29/66681* (2013.01); *H01L 29/7835* (2013.01); *H01L 21/266* (2013.01); *H01L 21/2652* (2013.01)

(58) Field of Classification Search
CPC ................... H01L 29/66674; H01L 29/66681; H01L 29/7801; H01L 29/7816; H01L 29/7833
See application file for complete search history.

(56) References Cited

U.S. PATENT DOCUMENTS

2007/0221965 A1* 9/2007 Miller ................ H01L 21/2253 257/288
2010/0117150 A1* 5/2010 Pendharkar ..... H01L 21/823814 257/337

* cited by examiner

*Primary Examiner* — Jae Lee
(74) *Attorney, Agent, or Firm* — Jacqueline J. Garner; Frank D. Climino

(57) ABSTRACT

An integrated circuit and method having an extended drain MOS transistor, wherein a diffused drain is deeper under a field oxide element in the drain than in a drift region under the gate. A field oxide hard mask layer is etched to define a drain field oxide trench area. Drain dopants are implanted through the drain field oxide trench area and a thermal drain drive is performed. Subsequently, the drain field oxide element is formed.

8 Claims, 9 Drawing Sheets

SCHEME TO ALIGN LDMOS DRAIN EXTENSION TO MOAT

CROSS-REFERENCE TO RELATED APPLICATIONS

This application claims the benefit of priority under U.S.C. §119(e) of U.S. Provisional Application 61/918,394, filed Dec. 19, 2013, which is hereby incorporated by reference in its entirety.

FIELD OF THE INVENTION

This invention relates to the field of integrated circuits. More particularly, this invention relates to extended drain MOS transistors with extended drains in integrated circuits.

BACKGROUND OF THE INVENTION

An integrated circuit may contain an extended drain metal oxide semiconductor (MOS) transistor. The extended drain has a drift region adjacent to the channel region of the extended drain MOS transistor, in combination with a field oxide element in the drain region. The extended drain MOS transistor may be a laterally diffused metal oxide semiconductor (LDMOS) transistor, a diffused metal oxide semiconductor (DMOS) transistor or a drain extended metal oxide semiconductor (DEMOS) transistor. Generally, an average doping in the drift region is less than half an average doping density in the source region of the extended drain MOS transistor. The field oxide element may be formed for example by shallow trench isolation (STI) or by local oxidation of silicon (LOCOS). It may be desirable to perform a thermal drive for the drain implant prior to forming the field oxide element, for example to reduce stress buildup around the field oxide element. It may also be desirable to photolithographically align the drain implant pattern and the field oxide pattern directly, for example to minimize gate-drain capacitance in the extended drain MOS transistor. Aligning the field oxide pattern directly to the drain implant may be problematic, due to a lack of topological features in the drain implant. Aligning the drain implant directly to the field oxide requires performing the drain thermal drive after forming the field oxide.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method having an extended drain MOS transistor, wherein a diffused drain is deeper under a field oxide element in the drain than in a drift region under the gate. A field oxide hard mask layer is etched to define a drain field oxide trench area. Drain dopants are implanted through the drain field oxide trench area and a thermal drain drive is performed. Subsequently, the drain field oxide element is formed.

DETAILED DESCRIPTION OF EXAMPLE EMBODIMENTS

Figure 1:
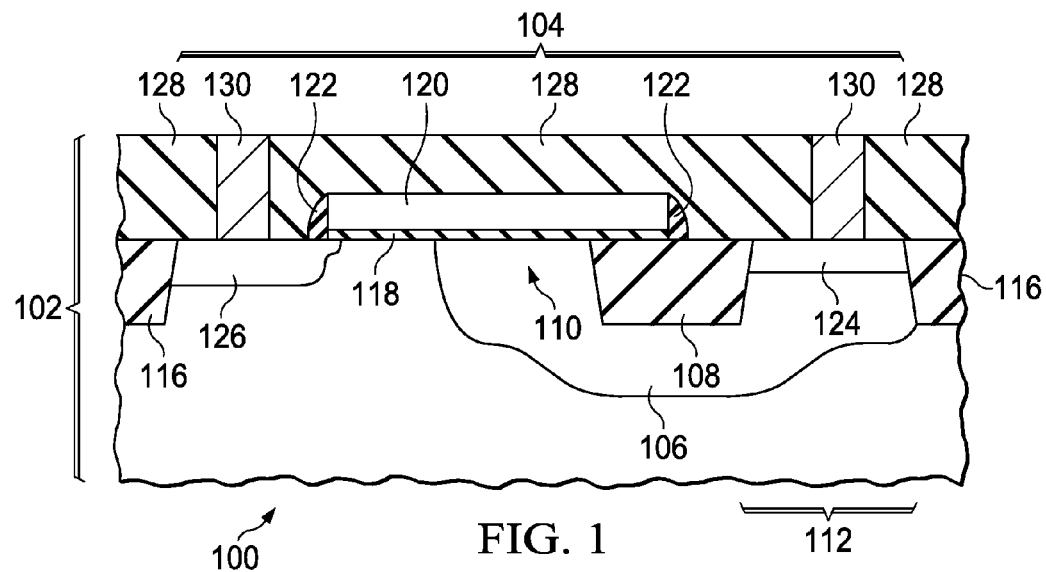
FIG. 1 is a cross-section of an integrated circuit containing an extended drain MOS transistor formed according to the first example.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an extended drain MOS transistor with a field oxide element in the extended drain may be formed by patterning and etching a field oxide hard mask, aligning a drain implant photoresist pattern to the etched field oxide hard mask, performing a drain implant and drain thermal drive, and subsequently forming the field oxide, for example by an STI process or a LOCOS process. The extended drain MOS transistor may be, for example, a LDMOS transistor, a DMOS transistor or a DEMOS transistor. In a first example, the drain implant pattern may be directly aligned to the etch field oxide hard mask. In the extended drain MOS transistor of an integrated circuit formed according to the first example, a drain junction under the field oxide is deeper than the drain junction under a gate of the extended drain MOS transistor. In a second example, the field oxide photoresist pattern may be left on the integrated circuit during the drain implant so that the drain implant is self-aligned to the field oxide hard mask.

FIG. 1 is a cross-section of an integrated circuit containing an extended drain MOS transistor formed according to the first example. The integrated circuit 100 is formed in and on a substrate 102, which may be a single crystal silicon wafer, a silicon-on-insulator (SOI) wafer, a hybrid orientation technology (HOT) wafer with regions of different crystal orientations, or other material appropriate for fabrication of the integrated circuit 100. The extended drain MOS transistor 104 includes a diffused drain region 106. A drain field oxide element 108 formed by STI is within the diffused drain region 106, between a drift region 110 in the diffused drain region 106 and a drain contact region 112 in the diffused drain region 106. The diffused drain region 106 is at least 50 nanometers deeper in the substrate 102 under the drain field oxide element 108 than in the drift region 110.

Adjacent field oxide elements 116 may be formed adjacent to the extended drain MOS transistor 104, for example to isolate the extended drain MOS transistor 104 from other components in the integrated circuit 100. For the purposes of this specification, the term "adjacent" may be understood to be within 10 microns. A gate dielectric layer 118 is formed on a top surface of the substrate in the extended drain MOS transistor 104. A gate 120 is formed over the gate dielectric layer 118 and extends onto the drain field oxide element 108. Optional gate sidewall spacers 122 may be formed on lateral surfaces of the gate 120. A heavily doped diffused drain region 124 may be formed in the drain contact region 112. An MOS source region 126 is formed in the substrate 102 adjacent to the gate 120 opposite the drain drift region 110. A pre-metallization dielectric layer 128 is formed over an existing top surface of the integrated circuit 100. Source and drain contacts 130 are formed through the pre-metallization dielectric layer 128 so as to make electrical contact to the drain contact region 112 and the source region 126.

Figure 2A:
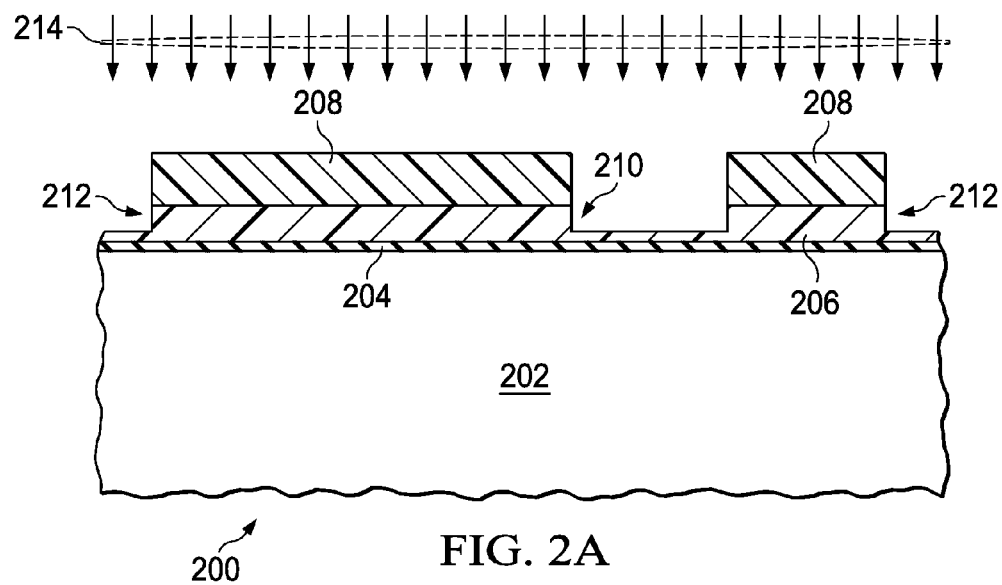
FIG. 2A through FIG. 2M are cross-sections of an integrated circuit formed according the first example, depicted in successive stages of fabrication, including some alternative instances of the first example.

FIG. 2A through FIG. 2M are cross-sections of an integrated circuit formed according the first example, depicted in successive stages of fabrication, including some alternative instances of the first example. Referring to FIG. 2A, the integrated circuit 200 is formed in and on a substrate 202, as described in reference to FIG. 1. An optional pad oxide layer 204 may be formed on a top surface of the substrate 202, for example by thermally oxidizing the top surface of the substrate 202 or by depositing a layer of silicon dioxide by thermal decomposition of tetraethyl orthosilicate, also known as tetraethoxysilane or TEOS. The pad oxide layer 204 if formed may be between 5 and 25 nanometers thick. A field oxide hard mask layer 206 is formed on an existing top surface of the integrated circuit 100. The field oxide hard mask layer 206 may be formed of one or more layers of dielectric material such as silicon nitride or silicon carbide. The field oxide hard mask layer 206 may be between 50 and 250 nanometers thick. A field oxide photoresist pattern 208 is formed over the field oxide hard mask layer 206 so as to expose the field oxide hard mask layer 206 in an area for a drain field oxide element 210 and possibly areas for adjacent field oxide elements 212. In an alternate instance of the first example, a dielectric mask of inorganic material, not shown, may be formed in place of the field oxide photoresist pattern 208. A field oxide hard mask etch process 214, for example a reactive ion etch process as depicted in FIG. 2A, is performed which removes at least half of material in the field oxide hard mask layer 206 in the drain field oxide element area 210 and the adjacent field oxide element areas 212. In one instance of the first example, the field oxide hard mask etch process 214 may be terminated before removing all the material from the field oxide hard mask layer 206 in the drain field oxide element area 210 and the adjacent field oxide element areas 212, as depicted in FIG. 2A.

Figure 2B:
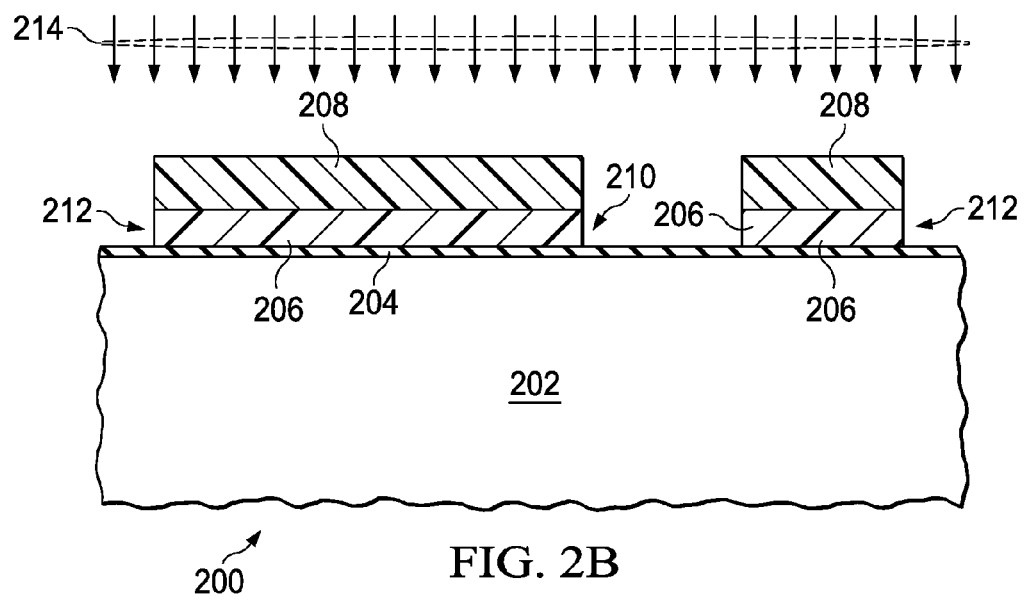

In another instance of the first example, the field oxide hard mask etch process 214 may be continued until all the material from the field oxide hard mask layer 206 is removed in the drain field oxide element area 210 and the adjacent field oxide element areas 212, as depicted in FIG. 2B. Photoresist may be removed from the field oxide photoresist pattern 208 during the field oxide hard mask etch process 214.

In the first example, the field oxide photoresist pattern 208 is removed after the field oxide hard mask etch process 214 is completed. The field oxide photoresist pattern 208 may be removed, for example, by exposing the integrated circuit 200 to an oxygen containing plasma, followed by a wet cleanup to remove any organic residue from an existing top surface of the integrated circuit 200.

Figure 2C:
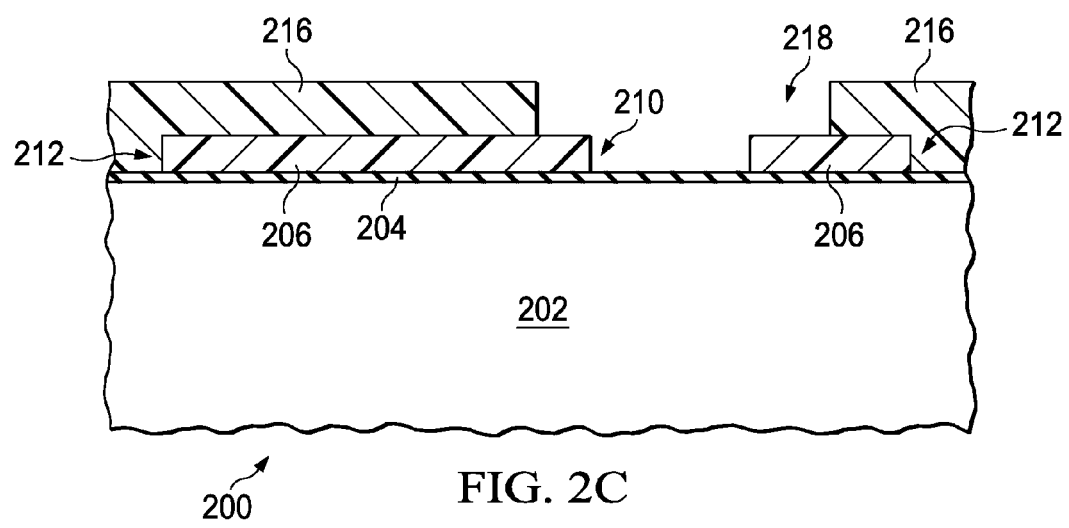

Referring to FIG. 2C, a drain implant photoresist pattern 216 is formed over the integrated circuit 200 so as to expose a drain implant area 218 overlapping the drain field oxide element area 210. The drain implant photoresist pattern 216 may be directly aligned to the etched field oxide hard mask layer 206.

Figure 2D:
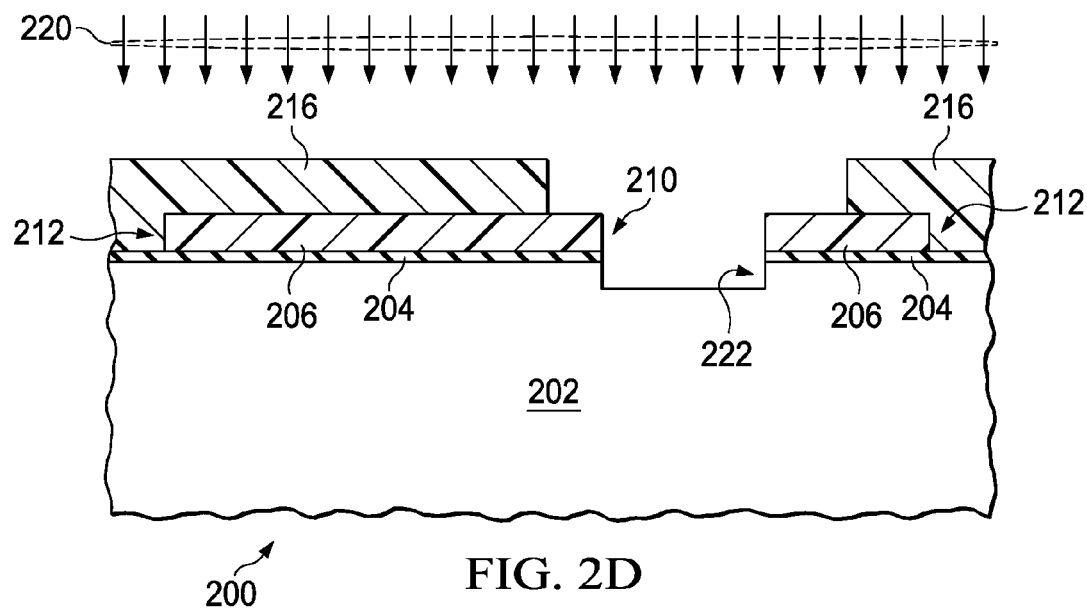

FIG. 2D depicts an alternate instance of the first example, wherein a first field oxide partial trench etch process 220 is performed which removes material from the substrate 202 under the drain field oxide element area 210 to form a first partial drain field oxide trench 222. The first partial drain field oxide trench 222 if formed may be between 25 and 100 nanometers deep.

Figure 2E:
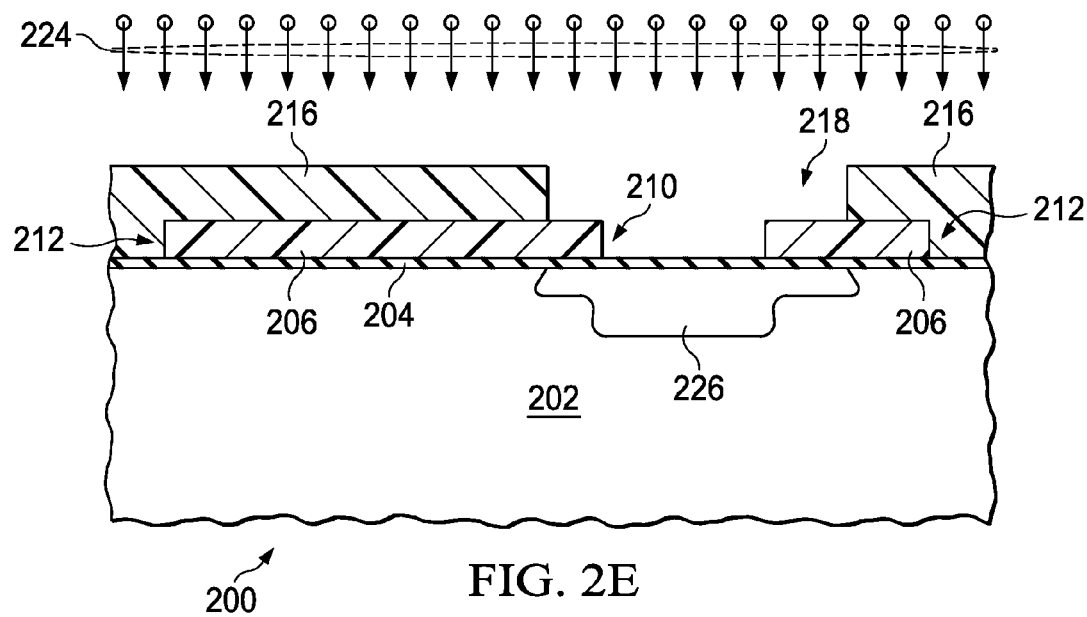

FIG. 2E depicts the integrated circuit 200 during a first drain implant process. A first set of drain dopants 224 is ion implanted into the substrate 202 under the drain implant area 218 to form a first drain implanted region 226. The field oxide hard mask layer 206 under the drain implant area 218 reduces a depth of the first drain implanted region 226 under the field oxide hard mask layer 206 by at least half the thickness of the field oxide hard mask layer 206 compared to under the drain field oxide element area 210. In an n-channel version of the extended drain MOS transistor, the first set of drain dopants 224 may include phosphorus, for example at a dose between $1 \times 10^{12}$ atoms/cm$^2$ and $5 \times 10^{13}$ atoms/cm$^2$. In a p-channel version of the extended drain MOS transistor, the first set of drain dopants 224 may include boron, for example at a dose between $1 \times 10^{12}$ atoms/cm$^2$ and $5 \times 10^{13}$ atoms/cm$^2$.

Figure 2F:
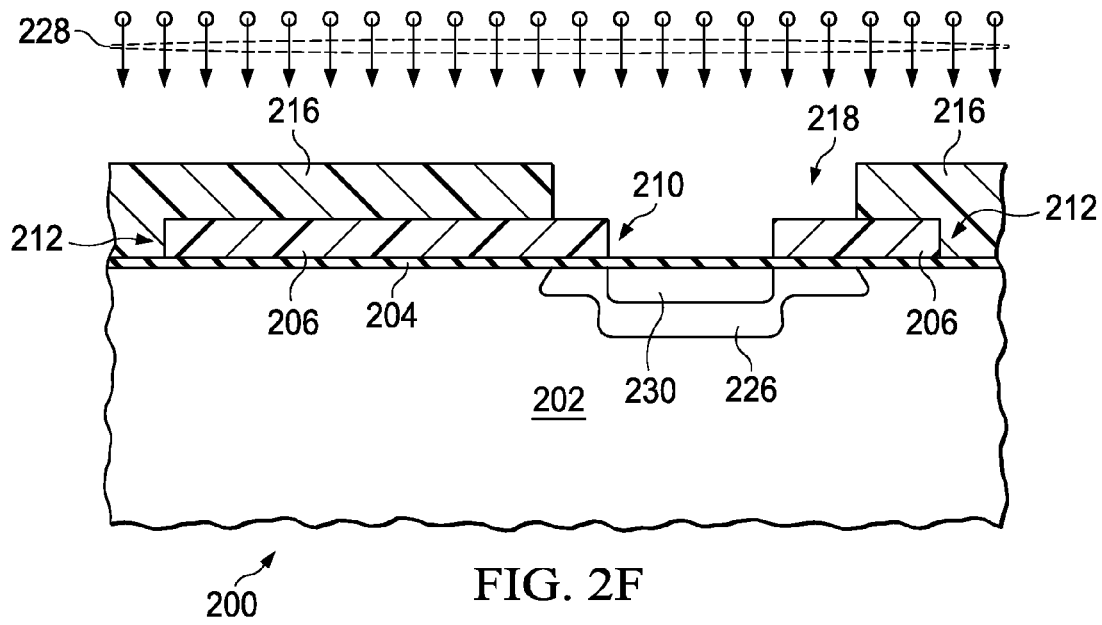

FIG. 2F depicts the integrated circuit 200 during an optional second drain implant process. A second set of drain dopants 228 may optionally be implanted into the substrate 202 under the drain field oxide element area 210 to form a second drain implanted region 230. An implant energy of the second set of drain dopants 228 is adjusted so that an average depth of dopants in the second set of drain dopants 228 is less than 75 percent of the thickness of the field oxide hard mask layer 206. This results in the second drain implanted region 230 being substantially self-aligned to the field oxide hard mask layer 206. In one instance of the instant example, the second set of drain dopants 228 may diffuse a shorter distance during a subsequent drain thermal drive operation than the first set of drain dopants 224. For example, in an n-channel version of the extended drain MOS transistor, the first set of drain dopants 224 may be phosphorus and the second set of drain dopants 228 may be arsenic. The arsenic in the second set of drain dopants 228 may be implanted at an energy less than 200 keV. In a p-channel version of the extended drain MOS transistor, the first set of drain dopants 224 may be boron and the second set of drain dopants 228 may be gallium. The gallium in the second set of drain dopants 228 may be implanted at an energy less than 200 keV.

Figure 2G:
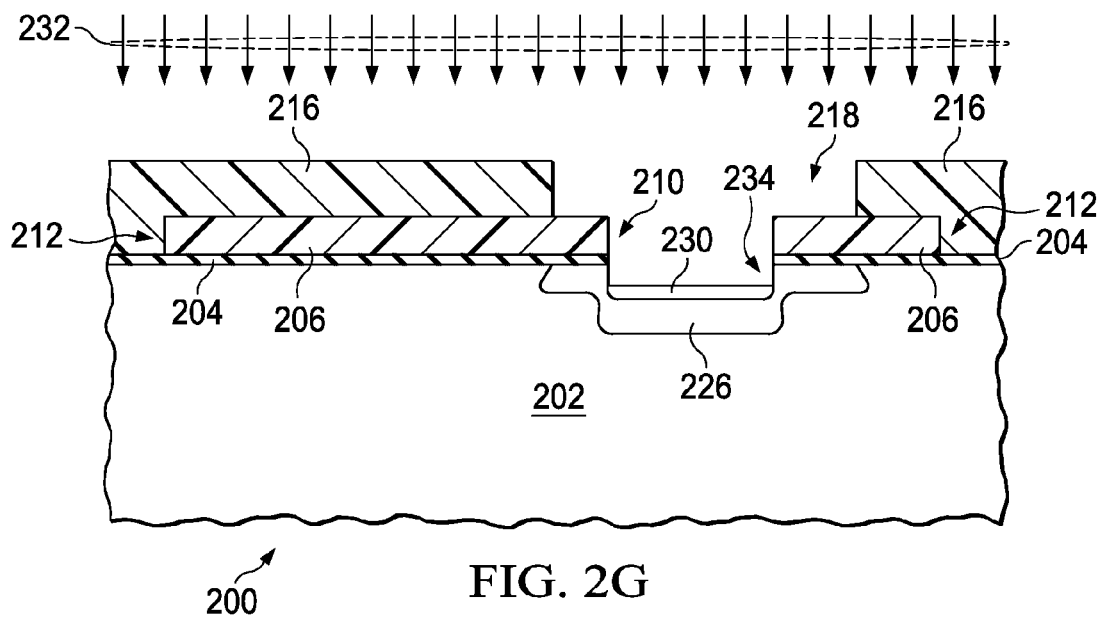

FIG. 2G depicts the integrated circuit 200 during an optional second field oxide partial trench etch process 232, performed after the drain implant processes depicted in FIG. 2E and FIG. 2F, which removes material from the substrate 202 under the drain field oxide element area 210 to form a second partial drain field oxide trench 234. The second partial drain field oxide trench 234 if formed may be between 25 and 100 nanometers deep.

Figure 2H:
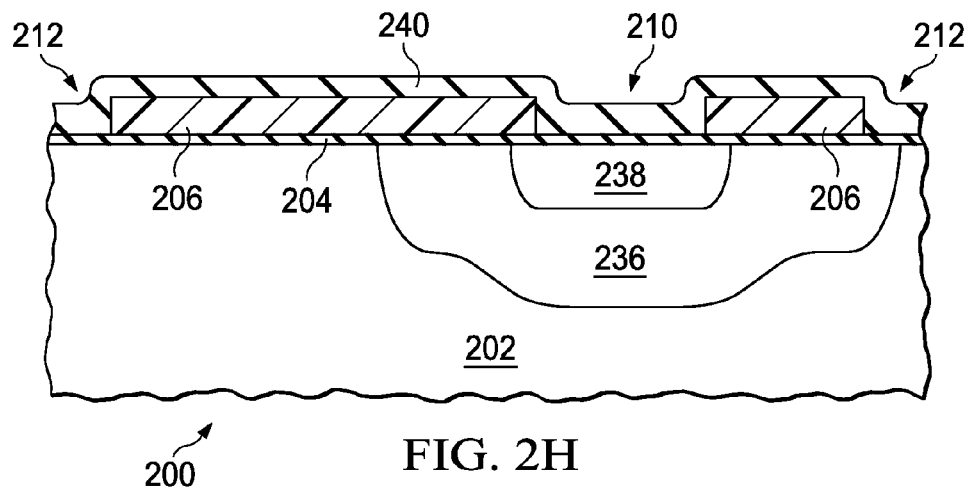

FIG. 2H depicts the integrated circuit after a drain thermal drive operation, which heats the integrated circuit 200 sufficiently so that dopants in the first set of drain dopants in the first drain implanted region, discussed in reference to FIG. 2E, are diffused laterally and vertically to a desired extent, to form a first diffused drain region 236. The first diffused drain region 236 is at least 50 nanometers deeper under the drain field oxide element area 210 than under the field oxide hard mask layer 206. In one instance of the instant example, the drain thermal drive operation may include heating the integrated circuit 200 to a temperature between 100° C. and 1150° C. for a time duration between 10 and 100 minutes. During the drain thermal drive operation, the second set of drain dopants in the second drain implanted region, discussed in reference to FIG. 2F, diffuse to a lesser extent than the first set of drain dopants to form a second diffused drain region 238. In one instance of the instant example, an optional diffusion cap layer 240, for example 50 to 150 nanometers of silicon dioxide, may be formed over the integrated circuit 200 prior to the drain thermal drive operation.

Figure 2I:
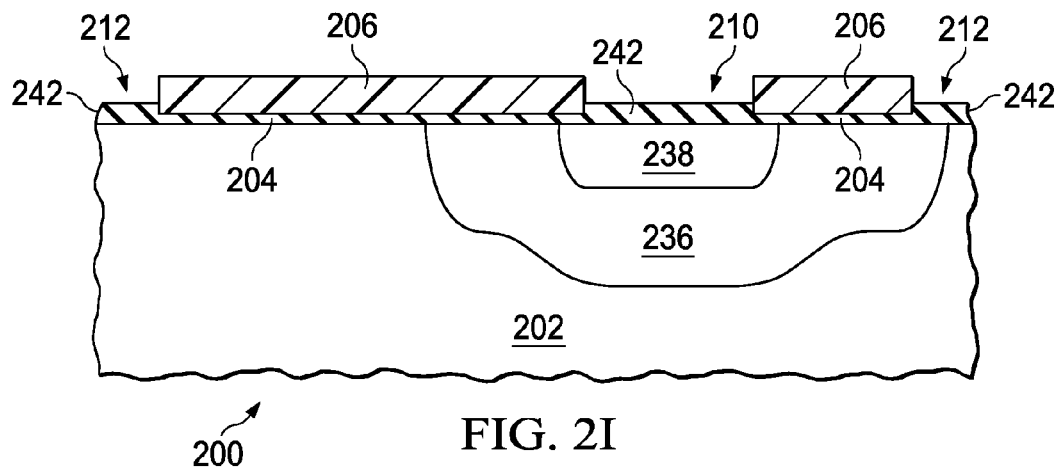

FIG. 2I depicts the integrated circuit 200 after an alternate version of the drain thermal drive operation, wherein an oxide layer 242 grows in the drain field oxide element area 210 and the adjacent field oxide element areas 212. For example, between 0.1 and 10 torr of oxygen may be added to an ambient over the integrated circuit 200 during the drain thermal drive operation, in order to grow the oxide layer 242.

Figure 2J:
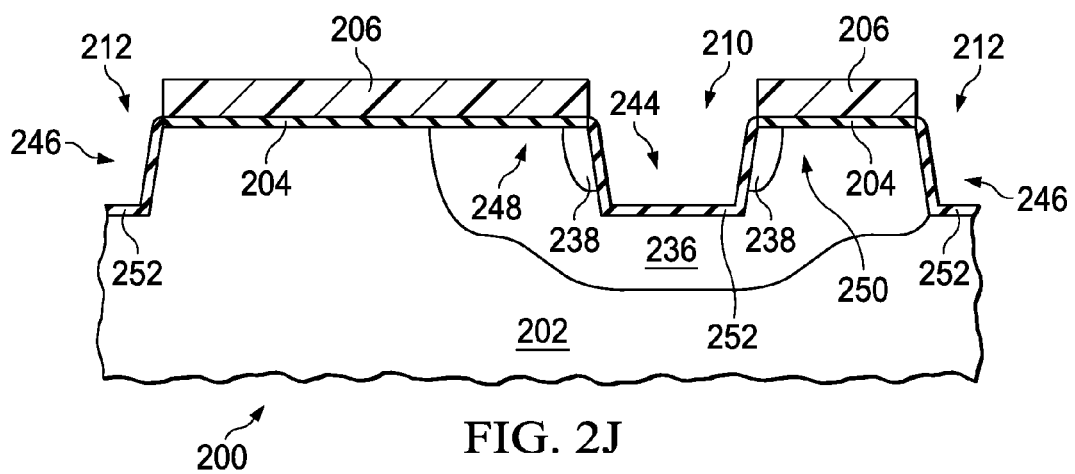

FIG. 2J depicts the integrated circuit 200 after forming field oxide trenches in an STI process. An STI trench etch process, not shown, removes material from the pad oxide layer 204 and the substrate 202 to form a drain field trench 244 under the drain field oxide element area 210 and adjacent field oxide trenches 246 under the adjacent field oxide element areas 212. The field oxide trench etch process may include, for example, a reactive ion etch step with fluorine ions. An average depth of the first diffused drain region 236 in the substrate 202 under the drain field oxide trench 244 is at least 50 nanometers deeper than an average depth of the first diffused drain region 236 under the field oxide hard mask layer 206.

The first diffused drain region 236 extends under the drain field oxide trench 244 to connect a drain drift region 248 in the first diffused drain region 236 with a drain contact region 250 also in the first diffused drain region 236. The second diffused drain region 238 extends along sidewalls of the drain field oxide trench 244, but may not necessarily extend to a bottom of the drain field oxide trench 244. In one instance of an n-channel version of the extended drain MOS transistor wherein arsenic is only implanted in the second set of dopants described in reference to FIG. 2G, more than 90 percent of arsenic implanted into the substrate 202 is disposed within 500 nanometers of the drain field oxide trench 244, which may advantageously reduce charge accumulation at sidewalls of the drain field oxide trench 244 from hot carriers.

An optional trench liner dielectric layer 252 may be formed on bottoms and sidewalls of the drain field oxide trench 244 and the adjacent field oxide trenches 246. In one instance of the instant example, the trench liner dielectric layer 252 if formed may be between 2 and 30 nanometers thick. The trench liner dielectric layer 252 may be formed, for example, by thermal oxidation of material in the substrate 202 at the bottoms and sidewalls of the drain field oxide trench 244 and the adjacent field oxide trenches 246. The trench liner dielectric layer 252 may include a deposited dielectric layer such as silicon dioxide or silicon nitride.

Figure 2K:
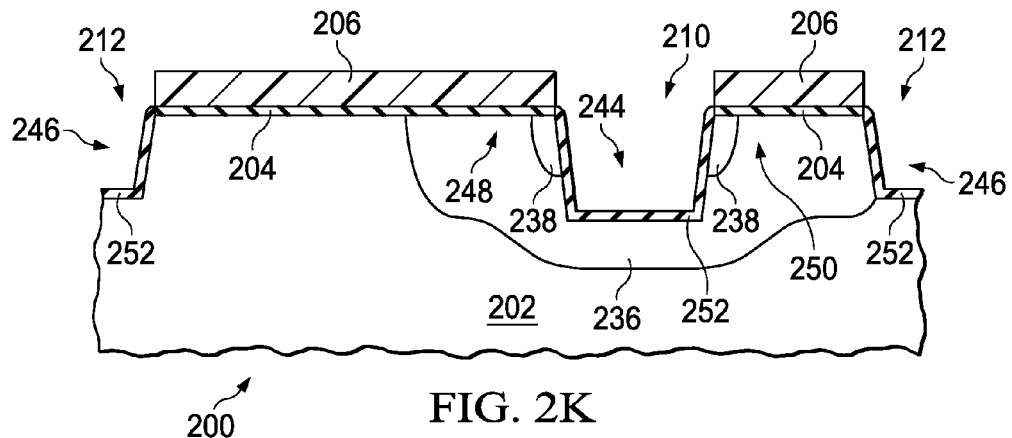

The instance of the instant example depicted in FIG. 2J has substantially equal depths of the drain field oxide trench 244 and the adjacent field oxide trenches 246. Other instances of the instant example, formed according to variations wherein material is removed from the substrate 202 under the drain field oxide element area 210 prior to performing the field oxide trench etch process, for example the variations discussed in reference to FIG. 2D and FIG. 2G, will produce a field oxide trench 244 which is between 25 and 100 nanometers deeper than the adjacent field oxide trenches 246. FIG. 2K depicts the integrated circuit 200 with a drain field oxide trench 244 that is deeper than the adjacent field oxide trenches 246. An average depth of the first diffused drain region 236 from the top surface of the substrate 202 under the drain field oxide trench 244 is at least 50 nanometers deeper than an average depth of the first diffused drain region 236 under the field oxide hard mask layer 206. Forming an extended drain MOS transistor with a deeper drain field oxide trench 244 may advantageously allow operation of the MOS at a higher drain potential than would be possible with a shallower drain field oxide trench. In one instance of the instant example, a depth of the drain field oxide trench 244 may be adjusted to obtain a desired operating potential of the extended drain MOS transistor.

Figure 2L:
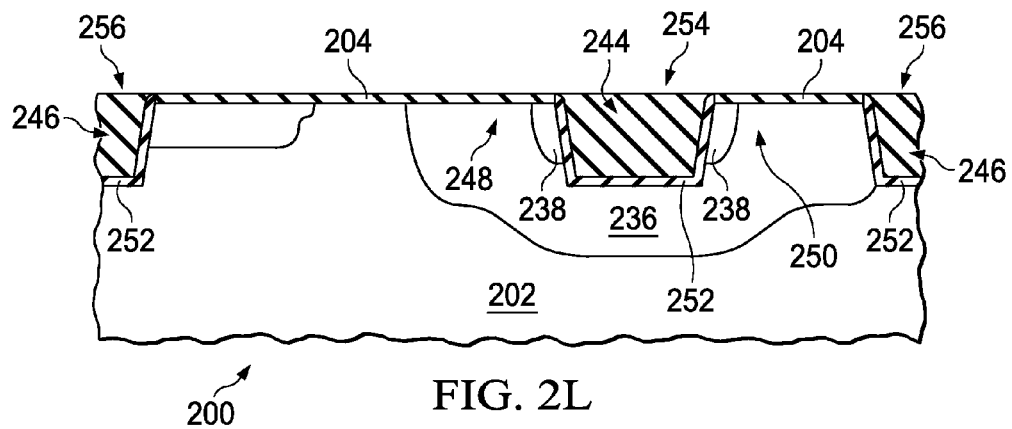

FIG. 2L depicts the integrated circuit 200 after completion of field oxide fill and planarization operations which form a drain field oxide element 254 in the drain field oxide trench 244 and adjacent field oxide elements 256 in the adjacent field oxide trenches 246. The field oxide fill operation forms dielectric material in the drain field oxide trench 244 and the adjacent field oxide trenches 246. The field oxide planarization operation produces top surfaces of the drain field oxide element 254 and adjacent field oxide elements 256 which are substantially coplanar with a top surface of the substrate 202 or a top surface of the pad oxide layer 204 as depicted in FIG. 2L.

Figure 2M:
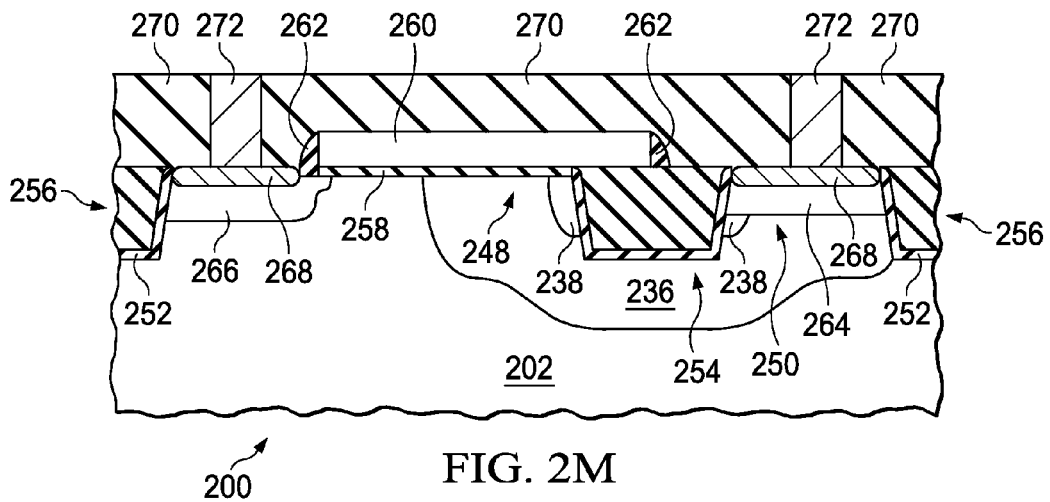

FIG. 2M depicts the integrated circuit 200 after formation of additional elements of the extended drain MOS transistor, similar to those described in reference to FIG. 1. A gate dielectric layer 258 is formed on a top surface of the substrate 202 over the drain drift region 248. A gate 260 is formed over the gate dielectric layer 258 and extends onto the drain field oxide element 254. Optional gate sidewall spacers 262 may be formed on lateral surfaces of the gate 260. A heavily doped diffused drain region 264 may be formed in the drain contact region 250. An MOS source region 266 is formed in the substrate 202 adjacent to the gate 260 opposite the drain drift region 248. Optional metal silicide layers 268 may be formed on the top surface of the substrate 202 in the drain contact region 250 and the source region 266, for example to reduce electrical resistance to the drain contact region 250 and the source region 266. A pre-metallization dielectric layer 270 is formed over an existing top surface of the integrated circuit 200. Source and drain contacts 272 are formed through the pre-metallization dielectric layer 270 so as to make electrical contact to the drain contact region 250 and the source region 266, through the silicide layers 268 if present.

Figure 3A:
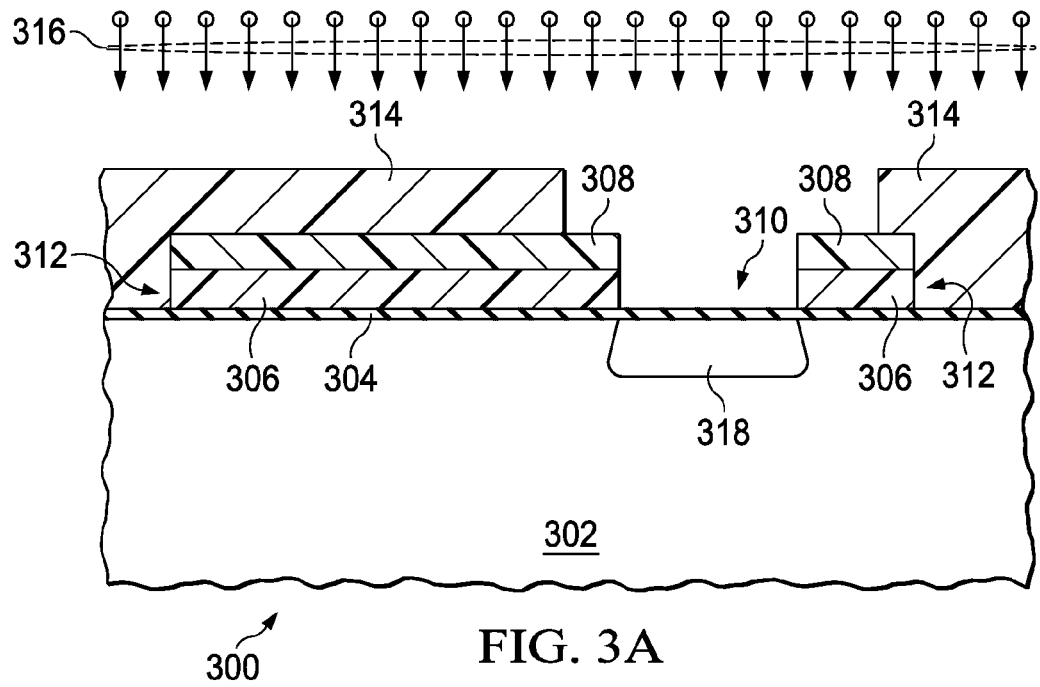
FIG. 3A through FIG. 3E are cross-sections of an integrated circuit formed according the second example, depicted in successive stages of fabrication.

FIG. 3A through FIG. 3E are cross-sections of an integrated circuit formed according the second example, depicted in successive stages of fabrication. Referring to FIG. 3A, the integrated circuit 300 is formed in and on a substrate 202, as described in reference to FIG. 1. An optional pad oxide layer 304 may be formed on a top surface of the substrate 302, as described in reference to FIG. 2A. A field oxide hard mask layer 306 is formed on an existing top surface of the integrated circuit 300, as described in reference to FIG. 2A. A field oxide photoresist pattern 308 is formed over the field oxide hard mask layer 306 so as to expose the field oxide hard mask layer 306 in an area for a drain field oxide element 310 and possibly areas for adjacent field oxide elements 312. In a variation of the second example, a dielectric mask of inorganic material, not shown, may be formed in place of the field oxide photoresist pattern 308. A field oxide hard mask etch process, not shown, is performed which removes material from the field oxide hard mask layer 306 in the drain field oxide element area 310 and the adjacent field oxide element areas 312, as described in reference to FIG. 2A and FIG. 2B.

In one instance of the second example, the field oxide photoresist pattern 308 is left on the integrated circuit through a subsequent drain implant operation, as depicted in FIG. 3A. A drain implant photoresist pattern 314 is formed over the integrated circuit 200 so as to expose the drain field oxide element area 310.

A first drain implant process is performed which implants a first set of drain dopants 316 is ion implanted into the substrate 302 under the drain field oxide element area 310 to form a first drain implanted region 318. An implant energy of the first set of drain dopants 316 is adjusted so that an average depth of dopants in the first drain implanted region 318 is less than 75 percent of a combined thickness of the field oxide photoresist pattern 308 and the field oxide hard mask layer 306, and results in the first drain implanted region 318 being formed substantially coincident with the drain field oxide element area 310. In an n-channel version of the extended drain MOS transistor, the first set of drain dopants 316 may include phosphorus, for example at a dose between $1\times10^{12}$ atoms/cm$^2$ and $5\times10^{13}$ atoms/cm$^2$. In a p-channel version of the extended drain MOS transistor, the first set of drain dopants 316 may include boron, for example at a dose between $\times10^{12}$ atoms/cm$^2$ and $5\times10^{13}$ atoms/cm$^2$.

Figure 3B:
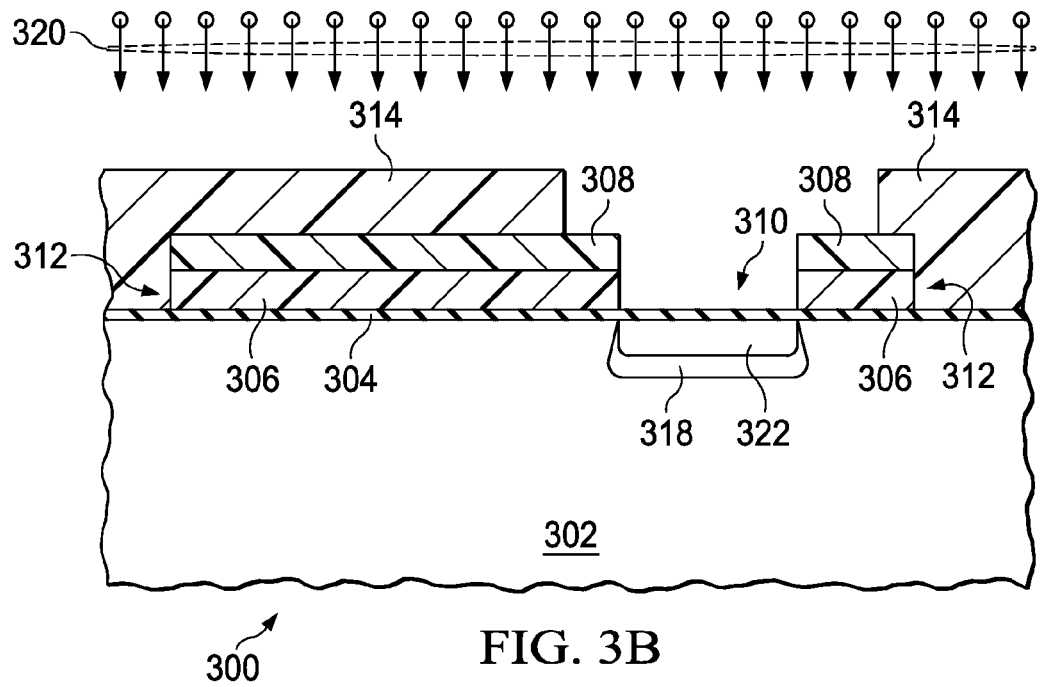

FIG. 3B depicts the integrated circuit 300 during an optional second drain implant process. A second set of drain dopants 320 may optionally be implanted into the substrate 302 under the drain field oxide element area 310 to form a second drain implanted region 322. An implant energy of the second set of drain dopants 320 is adjusted so that an average depth of dopants in the second drain implanted region 322 is less than 50 percent of a combined thickness of the field oxide photoresist pattern 308 and the field oxide hard mask layer 306, so that the second drain implanted region 322 is substantially coincident with the drain field oxide element area 310. In one instance of the instant example, the second set of drain dopants 228 may diffuse a shorter distance during a subsequent drain thermal drive operation than the first set of drain dopants 224. For example, in an n-channel version of the extended drain MOS transistor, the first set of drain dopants 224 may be phosphorus and the second set of drain dopants 228 may be arsenic. In a p-channel version of the extended drain MOS transistor, the first set of drain dopants 224 may be boron and the second set of drain dopants 228 may be gallium.

FIG. 3B depicts the first drain implanted region 318 extending deeper into the substrate 302 than the second drain implanted region 322. In a variation of the third example, the second drain implanted region 322 may extend deeper into the substrate 302 than the first drain implanted region 318.

The first drain implanted region 318 and optional second drain implanted region 322 if formed, as depicted in FIG. 3A and FIG. 3B, may be achieved by forming a sufficiently thick field oxide hard mask layer 306, allowing removal of the field oxide photoresist pattern 308 prior to implanting the first set of drain dopants 224 and the second set of drain dopants 228. Alternately, a sacrificial layer, for example silicon dioxide or organic polymer may be formed over the field oxide hard mask layer 306 and patterned concurrently with the field oxide hard mask layer 306 to provide a sufficiently thick absorbing layer for the first set of drain dopants 224 and the second set of drain dopants 228.

Figure 3C:
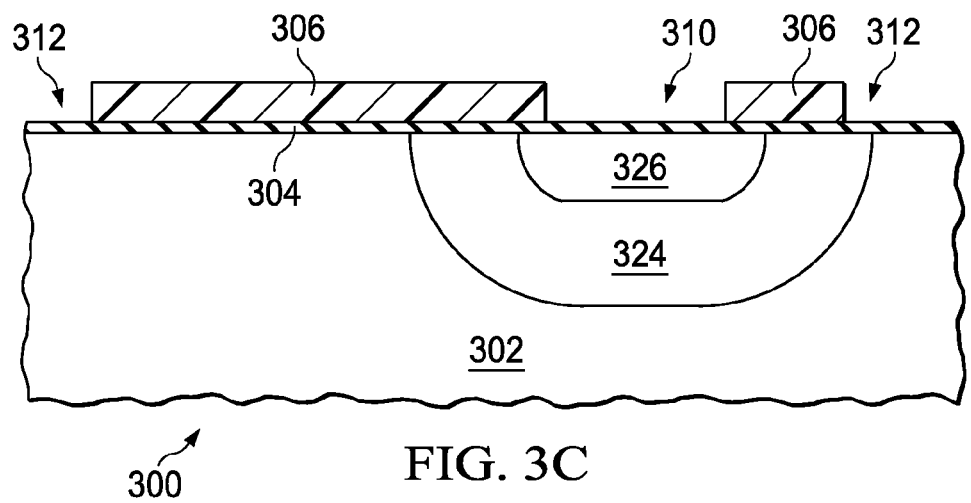

FIG. 3C depicts the integrated circuit after a drain thermal drive operation, which heats the integrated circuit 300 sufficiently so that the first set of drain dopants in the first drain implanted region, discussed in reference to FIG. 3A, are diffused to a desired extent, to form a first diffused drain region 324. In one instance of the instant example, the drain thermal drive operation may include heating the integrated circuit 200 to a temperature between 100° C. and 1150° C. for a time duration between 10 and 100 minutes. During the drain thermal drive operation, the second set of drain dopants in the second drain implanted region, discussed in reference to FIG. 3B, if formed, diffuse to a lesser extent than the first set of drain dopants to form a second diffused drain region 326. In one variation of the third example, an optional diffusion cap layer, not shown, may be formed over the integrated circuit 300 prior to the drain thermal drive operation, as discussed in reference to FIG. 2H. In another variation, an oxide layer, not shown, may be grown in the drain field oxide element area 310 and the adjacent field oxide element areas 312, as discussed in reference to FIG. 2I.

Figure 3D:
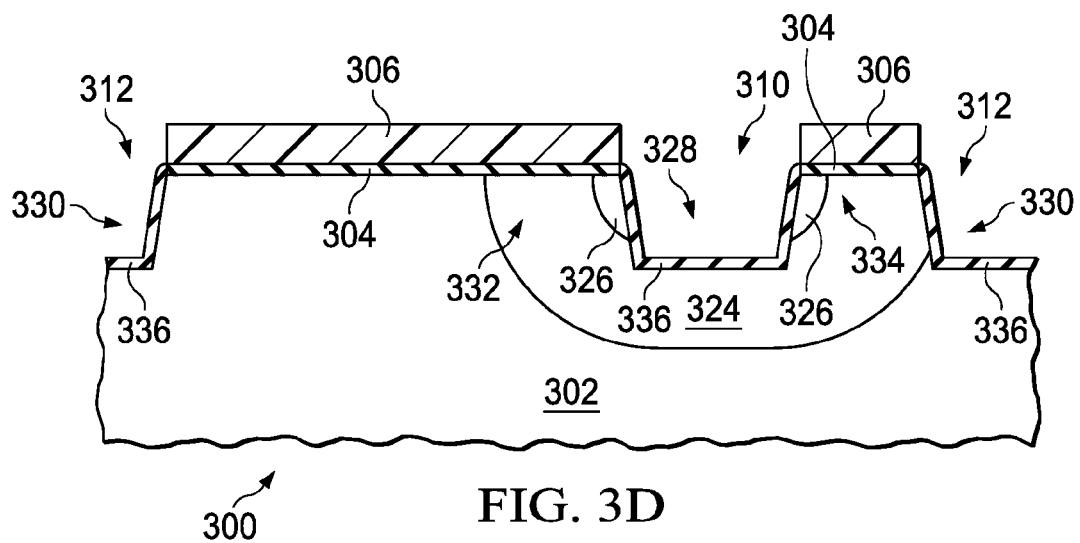

FIG. 3D depicts the integrated circuit 300 after forming a drain field oxide trench 328 under the drain field oxide element area 310 and adjacent field oxide trenches 330 under the adjacent field oxide element areas 312, as described in reference to FIG. 2J and FIG. 2K. The first diffused drain region 324 extends under the drain field oxide trench 328 to connect a drain drift region 332 in the first diffused drain region 324 with a drain contact region 334 also in the first diffused drain region 324. The second diffused drain region 326 extends along sidewalls of the drain field oxide trench 328, but may not necessarily extend to a bottom of the drain field oxide trench 328. In one instance of an n-channel version of the extended drain MOS transistor, arsenic in the second diffused drain region 326 advantageously reduces charge accumulation at sidewalls of the drain field oxide trench 328 from hot carriers. In a variation of the third example, the drain field oxide trench 328 may be deeper than the adjacent field oxide trenches 330, as described in reference to FIG. 2K. Forming an extended drain MOS transistor with a deeper drain field oxide trench 328 may advantageously allow operation of the MOS at a higher drain potential than would be possible with a shallower drain field oxide trench. In one instance of the instant example, a depth of the drain field oxide trench 328 may be adjusted to obtain a desired operating potential of the extended drain MOS transistor. An optional trench liner dielectric layer 336 may be formed on bottoms and sidewalls of the drain field oxide trench 328 and the adjacent field oxide trenches 330, as described in reference to FIG. 2J. An average depth of the first diffused drain region 324 from the top surface of the substrate 302 under the drain field oxide element area 310 is at least 50 nanometers deeper than an average depth of the first diffused drain region 324 under the thick field oxide hard mask layer 306. In one instance of an n-channel version of the extended drain MOS transistor wherein arsenic is implanted in the second set of dopants described in reference to FIG. 3B, more than 90 percent of arsenic implanted into the substrate 302 is disposed within 500 nanometers of the drain field oxide trench 328, which may advantageously reduce charge accumulation at sidewalls of the drain field oxide trench 328 from hot carriers.

Figure 3E:
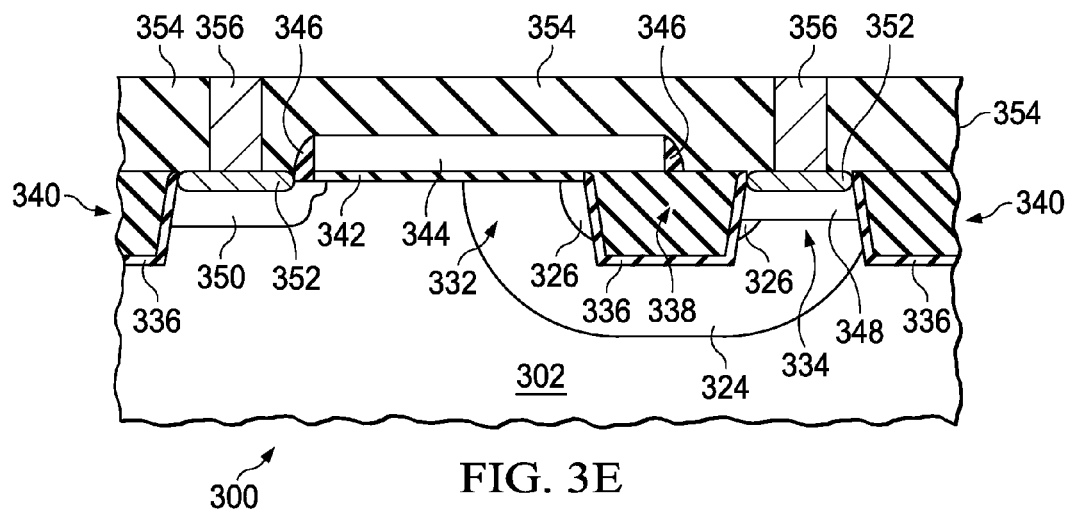

FIG. 3E depicts the integrated circuit 300 after formation of additional elements of the extended drain MOS transistor, similar to those described in reference to FIG. 1. Field oxide fill and planarization operations form a drain field oxide element 338 and adjacent field oxide elements 340 as described in reference to FIG. 2L. A gate dielectric layer 342 is formed on a top surface of the substrate 302 over the drain drift region 332. A gate 344 is formed over the gate dielectric layer 342 and extends onto the drain field oxide element 338. Optional gate sidewall spacers 346 may be formed on lateral surfaces of the gate 344. A heavily doped diffused drain region 348 may be formed in the drain contact region 334. An MOS source region 350 is formed in the substrate 302 adjacent to the gate 344 opposite the drain drift region 332. Optional metal silicide layers 352 may be formed on the top surface of the substrate 302 in the drain contact region 334 and the source region 350, for example to reduce electrical resistance to the drain contact region 334 and the source region 350. A pre-metallization dielectric layer 354 is formed over an existing top surface of the integrated circuit 300. Source and drain contacts 356 are formed through the pre-metallization dielectric layer 354 so as to make electrical contact to the drain contact region 334 and the source region 350, through the silicide layers 352 if present.

Figure 4:
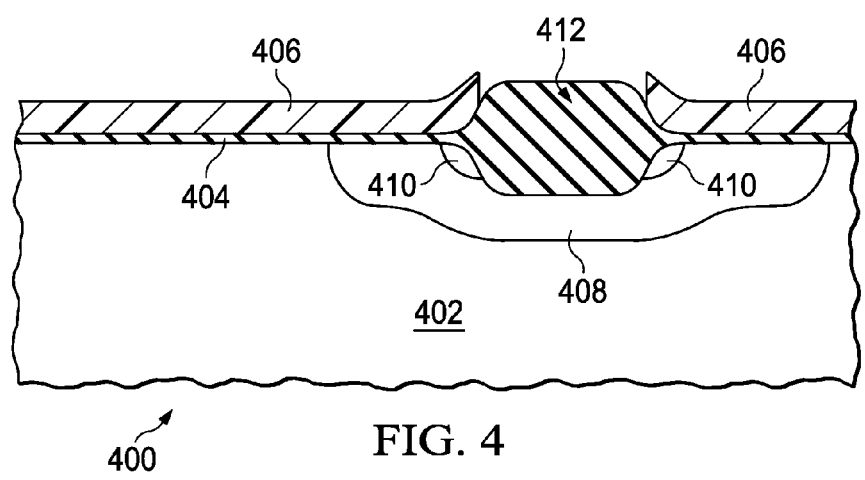
FIG. 4 is a cross-section of an integrated circuit containing an extended drain MOS transistor with a drain field oxide element formed by a LOCOS process.

The examples described above may be executed using LOCOS processes in place of the STI processes recited. FIG. 4 is a cross-section of an integrated circuit containing an extended drain MOS transistor with a drain field oxide element formed by a LOCOS process. The integrated circuit 400 is formed in and on a substrate 402, as described in reference to FIG. 1. An optional pad oxide layer 404 may be formed on the substrate as described in reference to FIG. 2A. A field oxide hard mask layer 406 is formed and patterned over the substrate 402 as described in reference to FIG. 2A and FIG. 2B. A first diffused drain region 408 and possibly an optional second diffused drain region 410 are formed in the substrate 402 as described in reference to FIG. 2E through FIG. 2I. The drain field oxide element 412 is formed by a LOCOS process so that the first diffused drain region 408 extends under the drain field oxide element 412, as described in reference to FIG. 2L. The second diffused drain region 410 if formed, may extend along sides, but not under, the drain field oxide element 412.

While various examples of the present invention have been described above, it should be understood that they have been presented by way of example only and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

What is claimed is:

1. A method of forming an integrated circuit containing an extended drain MOS transistor, comprising:
    forming a field oxide hard mask layer over a substrate of the integrated circuit;
    forming a field oxide photoresist pattern over the field oxide hard mask layer, so that an area in the field oxide hard mask layer for a drain field oxide element in the extended drain MOS transistor is exposed;
    performing a field oxide hard mask etch process which removes at least half of material in the field oxide hard mask layer in the drain field oxide element area;
    removing the field oxide photoresist pattern;
    forming a drain implant photoresist pattern over the integrated circuit, so that a drain implant area overlapping the drain field oxide element area is exposed;
    ion implanting a first set of drain dopants into a first drain implanted region in the substrate under the drain implant area, so that the field oxide hard mask layer under the drain implant area reduces a depth of the first drain implanted region under the field oxide hard mask layer by at least half a thickness of the field oxide hard mask layer compared to under the drain field oxide element area;
    removing the drain implant photoresist pattern;
    performing a drain thermal drive operation, which heats the substrate so that dopants of the first set of drain dopants in the first drain implanted region are diffused laterally and vertically to form a first diffused drain region, the first diffused drain region including a drift region adjacent to the drain field oxide element area; and
    forming a drain field oxide element in the drain field oxide element area.

2. The method of claim 1, including forming a pad oxide layer on the top surface of the substrate prior to the step of forming the field oxide hard mask layer, wherein the pad oxide layer is between 5 and 25 nanometers thick, so that the field oxide hard mask layer is formed on the pad oxide layer.

3. The method of claim 1, wherein the step of performing the field oxide hard mask etch process includes removing all material in the field oxide hard mask layer in the drain field oxide element area.

4. The method of claim 1, wherein the step of forming the drain field oxide element includes:
    performing a field oxide trench etch process which removes material from the substrate to form a drain field oxide trench under the drain field oxide element area; and
    performing field oxide fill and planarization operations to form a drain field oxide element in the drain field oxide trench, so that the first diffused drain region extends below the drain field oxide element.

5. The method of claim 1, wherein an average depth of the diffused drain region from a top surface of the substrate under the drain field oxide element is at least 50 nanometers deeper than an average depth of the diffused drain region in the drift region.

6. The method of claim 1, wherein:
    the extended drain MOS transistor is n-channel; and
    the first set of drain dopants includes phosphorus at a dose between $1\times10^{12}$ atoms/cm$^2$ and $5\times10^{13}$ atoms/cm$^2$.

7. The method of claim 6, including ion implanting a second set of drain dopants into the substrate under the drain field oxide element area, the second set of drain dopants including arsenic be implanted at an energy less than 200 keV, so that less than 10 percent of the arsenic in the second set of drain dopants impacting the field oxide hard mask layer under the drain implant area is deposited in the substrate.

8. The method of claim 7, wherein more than 90 percent of the arsenic implanted into the substrate is disposed within 500 nanometers of the drain field oxide element.

* * * * *